United States Patent [19]

Igel et al.

[11] Patent Number: 5,789,307
[45] Date of Patent: Aug. 4, 1998

[54] METHOD OF SEPARATING ELECTRONIC DEVICES CONTAINED IN A CARRIER

[75] Inventors: Gunter Igel, Teningen; Martin Mall, Freiburg, both of Germany

[73] Assignee: Deutsche ITT Industries GmbH, Freiburg, Germany

[21] Appl. No.: 797,584

[22] Filed: Feb. 7, 1997

[30] Foreign Application Priority Data

Feb. 7, 1996 [DE] Germany ............... 196 04 045.7

[51] Int. Cl.⁶ ............................................. H01L 21/60
[52] U.S. Cl. ................................ 438/464; 438/460
[58] Field of Search ........................... 438/460, 461, 438/462, 463, 464, 465

[56] References Cited

U.S. PATENT DOCUMENTS 4,729,971  3/1988  Coleman ............................ 438/464
5,179,035  1/1993  Shannon ............................ 438/464
5,597,767  1/1997  Mignardi et al. ................. 438/464

FOREIGN PATENT DOCUMENTS 4129206  4/1993  Germany.

*Primary Examiner*—Kevin Picardat
*Attorney, Agent, or Firm*—Plevy & Associates

[57] ABSTRACT

A method of separating electronic devices contained in a carrier which are provided at the surface of the carrier and are covered by a protective layer. Openings are provided above separation regions between adjacent electronic devices. The material of the carrier is removed in the separation regions starting from the openings, and the electronic devices are, at least during the material-removing process, confined in the carrier by respective regions with a material removal property different from that of the carrier.

20 Claims, 2 Drawing Sheets

METHOD OF SEPARATING ELECTRONIC DEVICES CONTAINED IN A CARRIER

FIELD OF THE INVENTION

The present invention relates to a method of separating electronic devices contained in a carrier which are provided at a surface thereof and are covered by a protective layer.

BACKGROUND OF THE INVENTION

Electronic devices contained in carrier are, for example, devices formed in a semiconductor wafer, particularly IC (integrated circuit) chips, discrete devices, sensing elements, display elements, resistors or conductive paths on Aluminum oxide, and the like. In practice, such electronic devices are generally separated by thinning the carrier and then dicing it by sawing. Such a method has the disadvantage which stem from mechanical stresses that cause cracks to form in the carrier during dicing which damage the electronic devices contained therein. Thus, such a method is relatively complicated and costly.

In addition, the carrier must be thick enough in order to have sufficient rigidity during processing. This is particularly problematic in semiconductor technology, since semiconductor wafers of greater diameter are desirable there, and therefore, must also have a correspondingly greater thickness for processing. As a result, a considerable portion of the wafer material is needed only to ensure rigidity, but not to obtain the desired properties of the electronic devices.

It is, therefore, an object of the present invention to provide an improved method of separating electronic devices contained in a carrier which is simpler and less costly than the prior art dicing method describe above.

SUMMARY

The present invention is directed to a method of separating electronic devices contained in a carrier at a surface thereof which involves providing openings in a protective layer which covers the electronic devices, the openings being provided above separation regions between adjacent electronic devices. This is accomplished by removing the material of the carrier in the separation regions starting from the openings. During the material-removing process, the electronic devices are at least confined in the carrier by respective regions with a material removal property different from that of the carrier.

The material removal property of the respective regions surrounding the electronic devices may be chosen so that the material in these regions will be removed faster or more slowly than the material of the carrier. If the rate of removal in these regions is slower, the material of the carrier between the regions surrounding the electronic devices will be removed faster starting from the openings, so that the electronic devices will be separated from the carrier together with a portion of respective regions surrounding the devices or with the respective entire regions. If the rate of material removal in the respective regions surrounding the electronic devices is chosen to be faster than in the carrier, the electronic devices will be separated from the carrier together with a portion of the carrier's material lying between the electronic devices and the respective regions.

In the method of the present invention, the electronic devices are separated from the carrier in a simple manner, starting from the surface of the carrier. By removing the material of the carrier in the manner described above, simultaneous separation of the electronic devices from each other and from the carrier is achieved. Thinning of the carrier is no longer necessary, so that process complexity can be reduced and material can be saved. The method of the present invention also makes it possible to bring the remaining carrier into the form of a new carrier in which electronic devices can be formed again. The carrier is thus, utilized in an efficient manner. This is particularly advantageous in semiconductor technology, where the material of semiconductor wafers is very expensive.

The method of the present invention is particularly advantageous if the electronic devices were already covered with a protective layer. In the case of very many electronic devices, such a protective layer is deposited in a previous fabrication step. In many arrangements, the openings required in the protective layer between adjacent electronic devices may already be present. In that case, the material of the carrier can be removed directly from the surface of the carrier starting from the openings in the protective layer, so that the electronic devices will be separated from the carrier. The method according to the present invention is then particularly simple and time-saving, and thus, low in cost. The method of the present invention can also be used in applications where a protective layer, which covers the entire carrier, was deposited. Then, the openings between adjacent electronic devices must be formed by a further patterning process. The protective layer may also be deposited as an additional layer on the surface of the carrier containing the electronic devices with the openings, so that the removal of material can start from the surface.

In a preferred application of the method according to the present invention, the electronic devices are provided on a front side and a back side of the carrier. In such an application, the electronic devices can be separated from the carrier on both the front and back sides simultaneously, i.e., it is no longer necessary to separate two electronic devices located opposite each other on the front and back sides of the carrier individually. That would be necessary if two adjacent pairs of devices (from the front and back sides of the carrier) were separated using conventional techniques. To separate such a pair of devices is expensive, since the individual pairs would have to be handled, aligned, and processed separately. In many applications, such as in semiconductor technology, that would involve a considerable amount of technical complexity. Furthermore, according to the present invention, the electronic devices on the front and back sides of the carrier can be completely independent on each other, so that different devices can be provided on the front side of the carrier and on the back side, for example. Moreover, the dimensions of the devices of the front side of the carrier may differ from those of the devices on the back side.

BRIEF DESCRIPTION OF THE DRAWINGS

The method of the present invention will now be explained in more detail with reference to the accompanying drawings, in which.

DETAILED DESCRIPTION OF THE INVENTION

Although the method of the present invention is useful for separating electronic devices contained in many different types of carriers, it is especially useful for separating electronic devices contained in semiconductor wafers. Hence, the method of the present invention will be described in reference to the embodiment of a semiconductor wafer with electronic devices.

Figure 1:
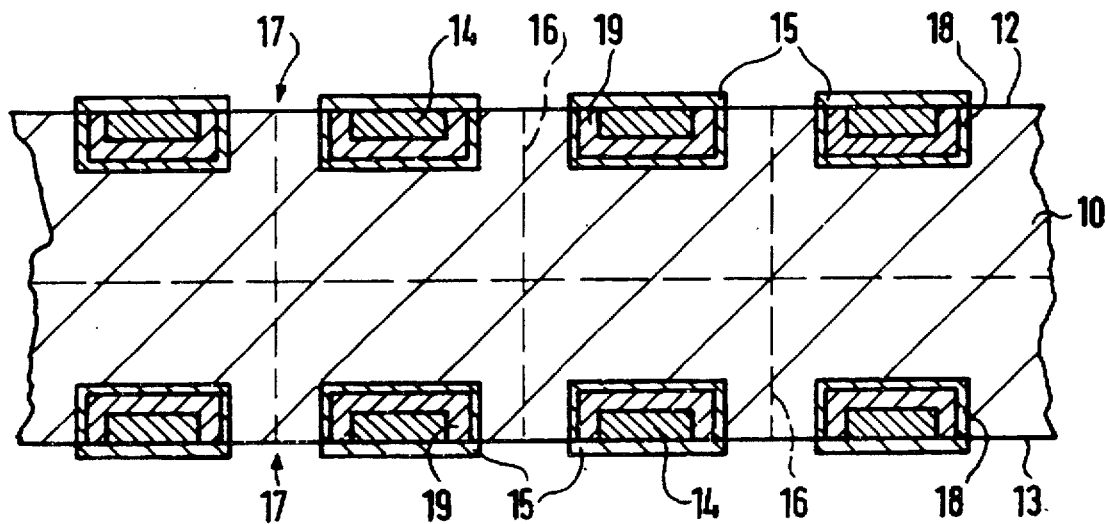
FIG. 1 is a cross section of a part of a semiconductor wafer with electronic devices on its front side and back side.

FIG. 1 shows a part of a semiconductor wafer 10 in a cross-sectional view. Electronic devices 14 are provided on a front side 12 and a back side 13 of the semiconductor wafer 10; four electronic devices 14 are shown on the front side 12, and four electronic devices 14 are shown on the back side 13. Each electronic device 14 is covered by a protective layer 15. Between the electronic devices 14, separation regions 16 are provided in the semiconductor wafer 10. The separation regions 16 must be present to permit the electronic devices 14 to be separated from each other or from the semiconductor wafer 10. In the protective layer 15, openings 17 are provided above the separation regions 16. Within the semiconductor wafer 10, each of the electronic devices 14 is surrounded by a respective delay layer 18. Between each of the electronic devices 14 and their respective delay layers 18, an intermediate region 19 of the material of the semiconductor wafer 10 is provided. The intermediate region 19 is not absolutely necessary for the present invention. Depending on the material of the delay layer 18 and the desired final size of the electronic devices 14, the delay layer 18 may also border directly on the respective electronic device 14.

Figure 2:
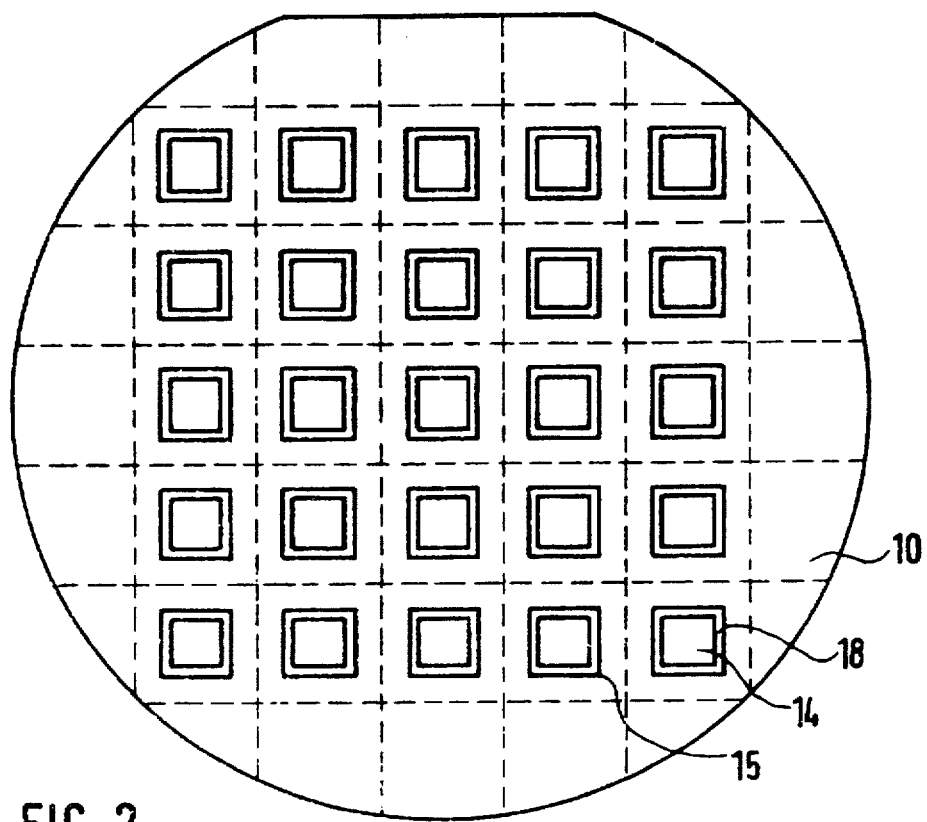
FIG. 2 is a top view of the semiconductor wafer of FIG. 1.

FIG. 2 shows a top view of a semiconductor wafer 10 containing the electronic devices 14. The electronic devices 14 are surrounded by their respective delay layers 18. The electronic devices 14 and their respective delay layers 18 are covered by the protective layer 15. In the protective layer 15, openings 17 can be seen between adjacent electronic devices 14.

The method according to the present invention involves subjecting the semiconductor wafer 10 to a material-removing process. Any process in which the material of the semiconductor wafer 10 is essentially isotropically removed is suitable for this purpose. "Essentially isotropically" as used herein means that the material-removing process has a component in a direction perpendicular to the surface of the semiconductor wafer 10 and components in directions parallel to this surface. The material must be removed in these directions simultaneously. This ensures that the separation of the electronic devices from the wafer is strong enough in the direction parallel to the surface of the wafer, so that device separation from the wafer is possible at a short distance from the surface of the wafer. A preferred process is an etching process, with plasma etching having the advantage that the material of the semiconductor wafer 10 is removed particularly fast. Depending on other conditions, however, other material-removing techniques, such as wet etching, may be advantageous. The front side 12 and the back side 13 of the semiconductor wafer 10 are subjected to the etching process simultaneously. The protective layer 15 is chosen to have a substantially lower etch rate than the material of the semiconductor wafer 10. Then the material of the semiconductor wafer 10 is etched starting from the openings 17 of the protective layer 15.

In the embodiment shown, the material of the delay layer 18 is chosen to have a lower etch rate than the material of the semiconductor wafer 10. In that case, the delay layer 18 is made of the same base material as the semiconductor wafer 10 and additionally contains one other, suitably selected chemical element. If the semiconductor wafer 10 is a silicon wafer, the material of the delay layer 18 will be a silicon compound, a silicon alloy, or doped silicon. The additional chemical element contained in the delay layer 18 is chosen so that the etch rate of the delay layer 18 is lower than that of the material of the silicon wafer. Silicon oxide or silicon nitride are especially suitable. During the etching process, the material of the semiconductor wafer is etched away simultaneously in a direction perpendicular to the surface of the wafer and in directions parallel to the surface. Since the delay layer 18 has a lower etch rate, the delay layer 18 or at least a portion thereof is preserved, this portion being determined by the etch-rate ratio of the delay layer 18 and the material of the semiconductor wafer 10. In this manner, the electronic devices 14, surrounded by the respective delay layers 18, are separated from the semiconductor wafer 10. If the etch rate of the delay layer 18 is chosen to be low enough, the delay layer 18 will determine the shape of the separated electronic devices 14.

The ratio of the etch rate of the delay layer 18 to that of the semiconductor wafer 10 may also be chosen so that the delay layer 18 will be completely etched away and that only the electronic devices 14 and a portion of the wafer material of the respective intermediate regions 19 surrounding them will be left.

The material of the protective layer 15 will generally be chosen so that the protective layer 15 or a substantial portion thereof will be left after the etching process to separate the electronic devices from the wafer 10, so that a sufficiently large portion of the protective layer 15 is preserved and can be used to protect the electronic devices 14. This can be achieved by selecting a material for the protective layer 15 which has a substantially lower etch rate than the material of the wafer 10. For example, the protective layer 15 may be made of metal. In the case of many electronic devices, it may already be present in the form of conductive paths formed on them.

The method according to the invention may be varied by choosing other properties or another location for the delay layer 18. For example, in another embodiment of the present invention, the respective regions confining the electronic devices are delay layers whose etch rate is different from that of the material of the wafer. More specifically, the delay layer 18 may surround the respective electronic device directly, without a respective intermediate region 19. Also, the delay layer 18 may be made of a material with a higher etch rate than that of the material of the semiconductor wafer 10. Then the openings 17 in the protective layer 15 must be provided in such a way that the delay layer 18 will be uncovered at the surfaces of the semiconductor wafer 10. In the etching step, only the delay layer 18 would then be etched away, thus separating the electronic devices 14. In either case, the wafer may be silicon, and the delay layer may contain silicon and at least one further chemical element. Silicon compounds, particularly silicon oxide and silicon nitride, silicon alloys, doped silicon, etc. may be used for the delay layer.

It is possible to use the semiconductor wafer 10 after separation of the electronic devices 14, since a considerable portion of the wafer material is preserved. To this end, the semiconductor wafer 10 must be machined on the front side 12 and the back side 13 in such a way that plane surfaces are obtained again. Then, electronic devices 14 can again be formed in the semiconductor wafer 10 by suitable process steps. It is also possible to form different electronic devices on the front side 12 and the back side 13 of the semiconductor wafer 10. The method can also be carried out if the electronic devices 14 on the front side 12 and the back 13 of the semiconductor wafer 10 are not located opposite each other in pairs but staggered with respect to one another.

In still another embodiment of the present invention, the respective regions confining the electronic devices are formed by an electric potential difference. This is particularly advantageous if the electronic devices 14 are separated from the wafer 10 by wet etching, since a region with a material removal property different from that of the wafer can then be created by applying a voltage. In this embodiment, no physical action on the wafer is required to form this region. By a suitable choice of the potential gradient resulting from the electric potential difference it is possible to determine whether the material in the region is removed faster or more slowly than the material of the wafer. The potential difference may also be formed, for example, by a pn junction, which may be connected to an external potential if necessary.

Figure 3:
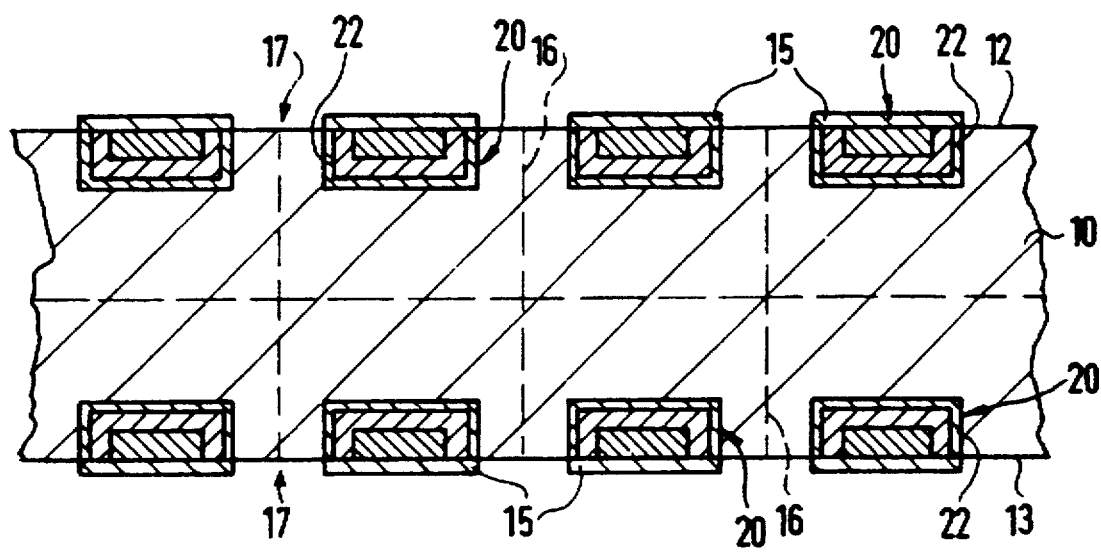
FIG. 3 is a cross section of a part of a semiconductor wafer with electronic devices made according to another embodiment of the present invention.

In a further embodiment of the present invention as shown in FIG. 3, where like elements are identified by like numerals, the respective delay layers described earlier is are insulator layers 22 of electronic devices 20 with an SOI (silicon-on-insulator) structure. In such an SOI structure, the insulator layer 22 is necessarily contained in the device 20, so that no additional delay layer need be formed.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method of separating electronic devices contained in a carrier and provided at a surface thereof, the electronic devices covered by a protective layer, the method comprising the steps of:

providing openings in the protective layer above separation regions located between adjacent ones of the electronic devices in the carrier; and removing material of the carrier in the separation regions starting from the openings, wherein the electronic devices are confined in the carrier, at least during the removal of the material of the carrier, by respective regions with a material removal property different from that of the carrier.

2. The method according to claim 1, wherein the carrier includes a front side and a back side, the electronic devices being provided on the front side and the back side of the carrier.

3. The method according to claim 1, wherein said step of removing material of the carrier is performed by etching.

4. The method according to claim 1, wherein said step of removing material of the carrier is performed by plasma etching.

5. The method according to claim 1, wherein said step of removing material of the carrier is performed essentially isotropically.

6. The method according to claim 1, wherein the material of the protective layer has a substantially lower etch rate than the material of the carrier.

7. The method according to claim 1, wherein the respective regions confining the electronic devices are formed by an electric potential difference.

8. The method according to claim 1, wherein the respective regions confining the electronic devices are delay layers whose etch rate is different from that of the material of the carrier.

9. The method according to claim 8, wherein the carrier is a silicon wafer, and the delay layers contain silicon and at least one further chemical element.

10. The method according to claim 8, wherein the electronic devices have a silicon-on-insulator structure and the delay layers are insulator layers the electronic devices.

11. A method of separating a plurality of electronic devices disposed in a semiconductor wafer of a predetermined material removal property, the electronic devices are separated from each other by regions of the semiconductor wafer and covered by a protective layer, the method comprising the steps of:

selectively creating openings in the protective layer to expose the regions of the semiconductor wafer which separate the electronic devices; and removing the exposed regions of the semiconductor wafer which separate the electronic devices, wherein each one of the electronic devices is confined by a region having a material removal property different from the predetermined material removal property of the semiconductor wafer.

12. The method according to claim 11, wherein the semiconductor wafer includes a front side and a back side, the electronic devices being provided on both the front side and the back side of the wafer.

13. The method according to claim 11, wherein said step of removing the exposed regions of the wafer is performed by etching.

14. The method according to claim 11, wherein said step of removing the exposed regions of the wafer is performed by plasma etching.

15. The method according to claim 11, wherein said step of removing the exposed regions of the wafer is performed essentially isotropically.

16. The method according to claim 11, wherein the protective layer has a substantially lower etch rate than the semiconductor wafer.

17. The method according to claim 11, wherein the regions confining the electronic devices are formed by an electric potential difference.

18. The method according to claim 11, wherein the regions confining the electronic devices are delay layers whose etch rate is different from that of the semiconductor wafer.

19. The method according to claim 18, wherein the semiconductor wafer comprises silicon, and the delay layers contain silicon and at least one dopant.

20. The method according to claim 18, wherein the electronic devices have a silicon-on-insulator structure and the delay layers are insulator layers of the electronic devices.

* * * * *